United States Patent
Fisher et al.

(12)

(10) Patent No.: US 6,812,593 B1
(45) Date of Patent: Nov. 2, 2004

(54) JUNCTION DEVICE WITH LOGIC

(75) Inventors: Philip H. Fisher, Toledo, OH (US); Trent P. Fisher, Yellow Springs, OH (US); Larry J. Linder, Xenia, OH (US)

(73) Assignee: SAS Automation Ltd., Xenia, OH (US)

( * ) Notice: Subject to any disclaimer, the term of this patent is extended or adjusted under 35 U.S.C. 154(b) by 358 days.

(21) Appl. No.: 09/881,940

(22) Filed: Jun. 15, 2001

Related U.S. Application Data

(60) Provisional application No. 60/212,468, filed on Jun. 16, 2000.

(51) Int. Cl.[7] .............................................. H01L 35/00
(52) U.S. Cl. ..................................................... 307/116
(58) Field of Search ......................... 307/116; 340/635, 340/657, 679, 687

(56) References Cited

U.S. PATENT DOCUMENTS

| | | | | |
|---|---|---|---|---|
| 3,711,827 A | * | 1/1973 | Houseman | 340/459 |
| 4,072,936 A | * | 2/1978 | Spirig | 340/566 |
| 5,460,210 A | * | 10/1995 | Koeninger | 141/94 |
| 5,495,228 A | * | 2/1996 | Futsuhara et al. | 340/507 |
| 6,271,747 B1 | * | 8/2001 | Fendt et al. | 340/436 |

* cited by examiner

*Primary Examiner*—Gregory J. Toatley, Jr.
(74) *Attorney, Agent, or Firm*—MacMillan, Sobanski & Todd, LLC

(57) ABSTRACT

A junction box receives a plurality of input signals. The input signals are combined in accordance with AND logic to close a plurality of output switches when all input signals are present. Both the inputs and outputs of the junction box are totally compatible with PNP, NPN or contact types of devices.

23 Claims, 4 Drawing Sheets

JUNCTION DEVICE WITH LOGIC

CROSS REFERENCE TO RELATED APPLICATIONS

This application claims the benefit of U.S. Provisional Application No. 60/212,468, filed Jun. 16, 2000.

BACKGROUND OF THE INVENTION

This invention relates in general to interfaces and junction boxes and particular to a junction device that includes logic functions.

Robotics are being increasingly used in manufacturing situations to handle work pieces. Such robotic devices are known to pick up a work piece, transport the work piece to a work station, such a numerically controlled machining operation, and install the work piece upon the work station. The robotic devices often include an arm that can swing, extend and elevate to move the work piece. The work piece itself is held in a gripper attached to the end of the arm. Such grippers are usually designed to accommodate the specific work piece and can include a plurality of fingers that close upon and thereby grasp the work piece.

The grippers are usually equipped with a plurality of position sensors that determine the position of the gripper fingers relative to the work piece. Such position sensors may be simple limit switches that are mechanically closed or opened upon contact with the work piece or may be more sophisticated proximity sensors that generate an output current or voltage as the fingers approach the work piece. Position sensors also can be mounted upon the robotic arm itself. The proximity type position sensors typically have an output stage that provides the sensor output signal to the robotic device. Upon receiving sensor output signals that all of the fingers are in place upon the work piece, the robotic device will proceed to the next step of its cycle, such as, for example, transporting the work piece to the next work station. Thus, the robotic device must receive a number of sensor output signals.

Position sensors also find wide spread use on machine tools and other mechanical devices where automatic control of movement is required. Thus, automatic processing machines and manufacturing equipment frequently include position sensors in their control systems to provide input signals to their logic circuits.

As described above, the position sensor output signals may vary from simple contacts, such as limit switch or relay contacts to current sources generated by PNP output transistors to current sinks generated by NPN output transistors. Also, the input circuit of the associated robotic device may include either PNP, NPN or contact devices. In the past, a specific junction box that is compatible with both the specific sensor output signal and the specific robotic device input signal requirements has been provided. This has increased the complexity of the design of robotic devices. Accordingly, it would be desirable to provide a common junction device or box that would be compatible with the various sensor output signals. It also would be desirable to provide a logic function in the junction device or box to provide a single output signal to the robotic device once all the sensors are indicating a closed status. By moving the logic to the junction box or device, the complexity of the robotic device wiring would be significantly reduced.

Additionally, it is known to connect several proximity sensors in series. Thus, an input signal is provided when all of the sensors are in a "closed position". With a prior art junction box, the signal generated by the series proximity sensors is passed directly to the junction box output However, it has been observed that when more than two proximity sensors are connected in series, the cumulative voltage drop across the sensors degrades the output signal excessively. Accordingly, it would be desirable to provide a junction box or device that is not affected by the series connection of sensors on an input to the box.

SUMMARY OF THE INVENTION

This invention relates to a junction device that includes logic functions.

The present invention is directed toward an improved junction box or device that receives output signals from a plurality of sensors and is operable to generate a single output upon receipt of output signals from all of the sensors. Additionally, the junction box or device includes the capability of providing an interface between a plurality of sensor output signal sources, such as a current source associated with a PNP solid state device, a current sink associated with a NPN solid state device, or a dry contact. Similarly, the output of the interface can be selected to be compatible with the input of the connected device. Thus, the junction box or device output also can be selected from one of a current source, a current sink or a dry contact output.

The present invention contemplates a plurality of rectifier bridge circuits that have input leads connected to the input signal terminals. The output leads of the rectifier bridge circuits are electrically connected to the inputs of a corresponding one of a plurality of optoisolator dual transistors. The optoisolator dual transistors are connected in series and thus function as an AND logic circuit. Connected between the optoisolator dual transistors are gate bias resistors for a pair of output power Field Effect Transistors (FET). The FET's are electrically connected to corresponding output terminals. A relay coil is connected to the drain of one of the output FET's.

Upon an input signal being present on all of the input terminals, all of the rectifier bridge circuits supply a current to their corresponding optoisolator dual transistor. The optoisolator dual transistors are responsive to the bridge circuit current to change from their non-conducting to their conducting state allowing a current to flow though the gate bias resistors for the output FET's. As a result, the gate voltages change and the FET's also change from their non-conducting to their conducting states which also pulls in the relay coil. Accordingly, current can flow through the output terminals connected to the FET's and any normally open relay contacts while current is blocked from flowing through any output terminals connected to normally closed relay contacts.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
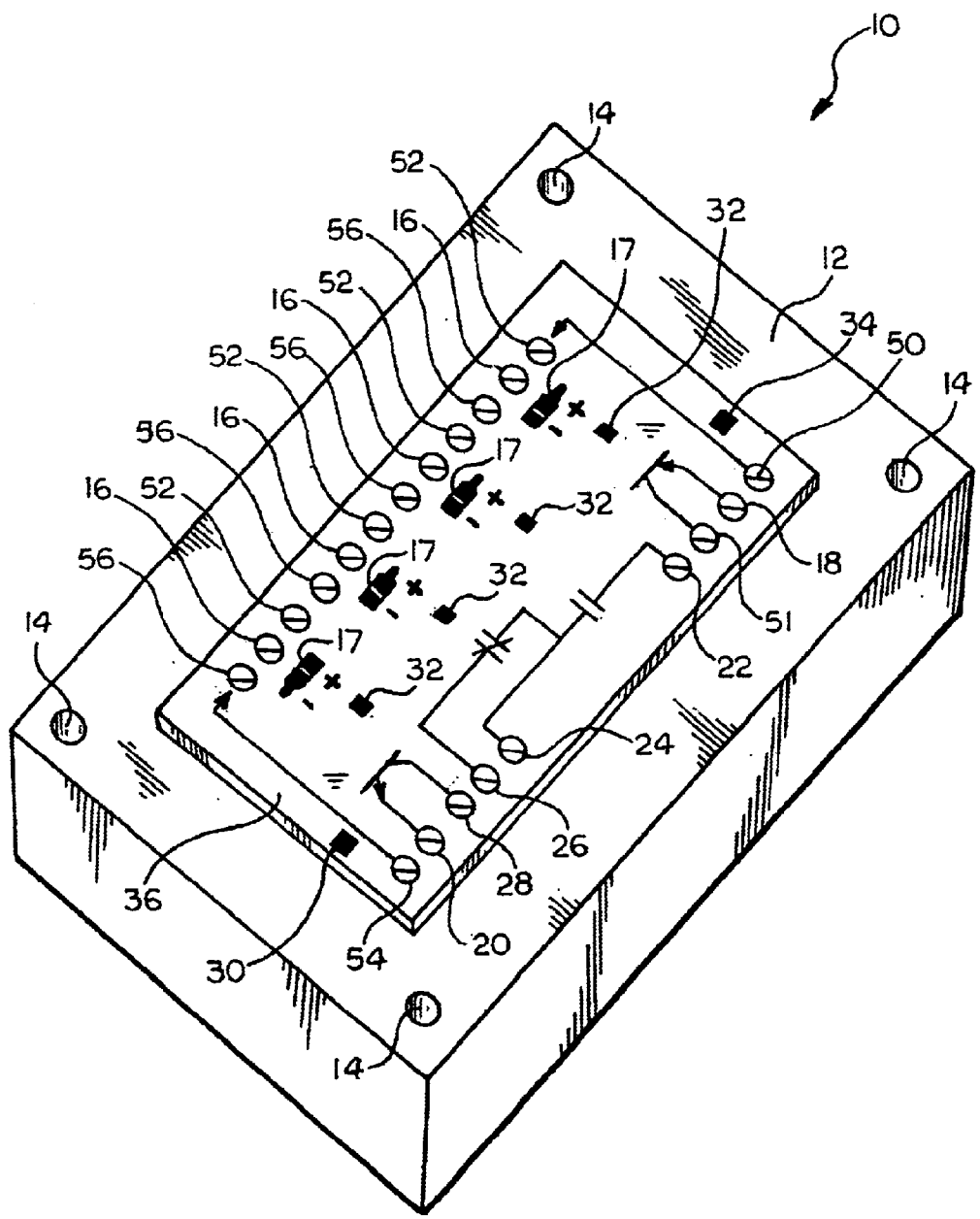
FIG. 1 is a perspective view of an interface junction device that is in accordance with the present invention.

Referring now to the drawings, there is illustrated in FIG. 1 a perspective view of an interface junction device 10 that is in accordance with the present invention. The junction device 10 includes a housing 12 that, in the preferred embodiment is a drip proof NEMA 4 enclosure. A plurality of bores 14 are formed through the corners of the housing 12 to permit surface mounting of the junction box 10.

A plurality of electrical input terminals 16 are disposed upon the top surface of the housing 10. Input terminals 16 are arrayed across the upper portion of the top surface of the housing 10 in FIG. 1. As will be explained below, the input terminals are provided in groups of three. Thus, the junction box 10 shown in FIG. 1 is designed to receive up to four discrete input signals. The invention also can be practiced for more or less input signals. Specifically, the inventors have designed boxes for two, four, six or eight input signals; however, it is not intended that the maximum number of input signals be limited to eight. Likewise, as will be explained below, the invention also can be practiced for an odd number of input signals. A plurality of two position shorting plugs 17 are disposed adjacent to the input terminals 16. One two position shorting plug is associated with each group of three terminals. As will be explained below, the position of the two position shorting plug is selected to match the input device with the two position shorting plug being placed in a first position for a PNP input device and in a second position for a NPN input device.

A power supply terminal 18 is provided along the lower portion of the upper portion of the top surface of the housing 10 in FIG. 1. Similarly, a common, or ground terminal, 20 is provided in the lower corner of the lower portion of the top surface of the housing 10 in FIG. 1. As will be explained below, the power and ground terminals 18 and 20 are used to supply power to the output circuits. A secondary power supply terminal 50 also is provided along the lower portion of the upper portion of the top surface of the housing 10 in FIG. 1. Similarly, a secondary common, or ground terminal, 54 is provided in the lower corner of the lower portion of the top surface of the housing 10 in FIG. 1. As will be explained below, the secondary power and ground terminals 50 and 54 are used to supply power to the logic and input circuits contained within the housing 12. In the preferred embodiment, the power supply is +24 volts D.C.; however, the invention also can be practiced with other values of supply voltage, such as, for example 120 or 240 volts. Additionally, the invention also can be s practiced with a −24 volt D.C. supply connected to the common terminals 20 and/or 42 and a ground connection attached to other terminals 18 and/or 50.

A plurality of output terminals are arrayed along the along the lower portion of the upper portion of the top surface of the housing 10 between the power terminal 18 and the common terminal 20. The output terminals include a first output terminal 22 for an output that is compatible with a PNP solid state device. The next three terminals, 22, 24 and 26, are outputs from a relay, that in the preferred embodiment is a "C" form relay. As shown in FIG. 1, the right most terminal 22 is connected to a set of normally open contacts while the left most terminal 26 is connected to a set of normally closed contacts. The center terminal 24 is a common connection for both sets of contacts. Finally, the left most output terminal 28 provides an output that is compatible with a NPN solid state device.

A power supply Light Emitting Diode (LED) 30 is located upon the top surface of the housing 12 and is illuminated to indicate that power is being supplied to the junction box 10. In the preferred embodiment, the first LED has an amber color. A plurality of LED's that are labeled 32 are provided adjacent to the two position shorting plugs 17. One of the LED's is associated with each of the input circuits and is illuminated when an input signal is received at the junction box 10. In the preferred embodiment, the input circuit LED's 32 have a yellow color. Finally, a logic indicator LED 34 is provided upon the top surface of the housing 12. As will be explained below, the junction box 10 generates an output signal only when there is an input signal present at all of the inputs. Accordingly, the junction box contains an "AND" logic circuit. The logic indicator LED 34 is illuminated when all inputs are present and, in the preferred embodiment, has a green color. The invention contemplates that a cover 36 formed from a transparent material, such as, for example, clear plastic, is provided over the LED's. Thus, the junction box provides a visual indication of the status of the power supply, each input source and a logic TRUE status.

Alternately, the junction box can 10 can be configured with multi-pin plugs (not shown) in place of terminals. The multi-pin plugs are electrically connected to cables that end in corresponding female connectors.

Figure 2:
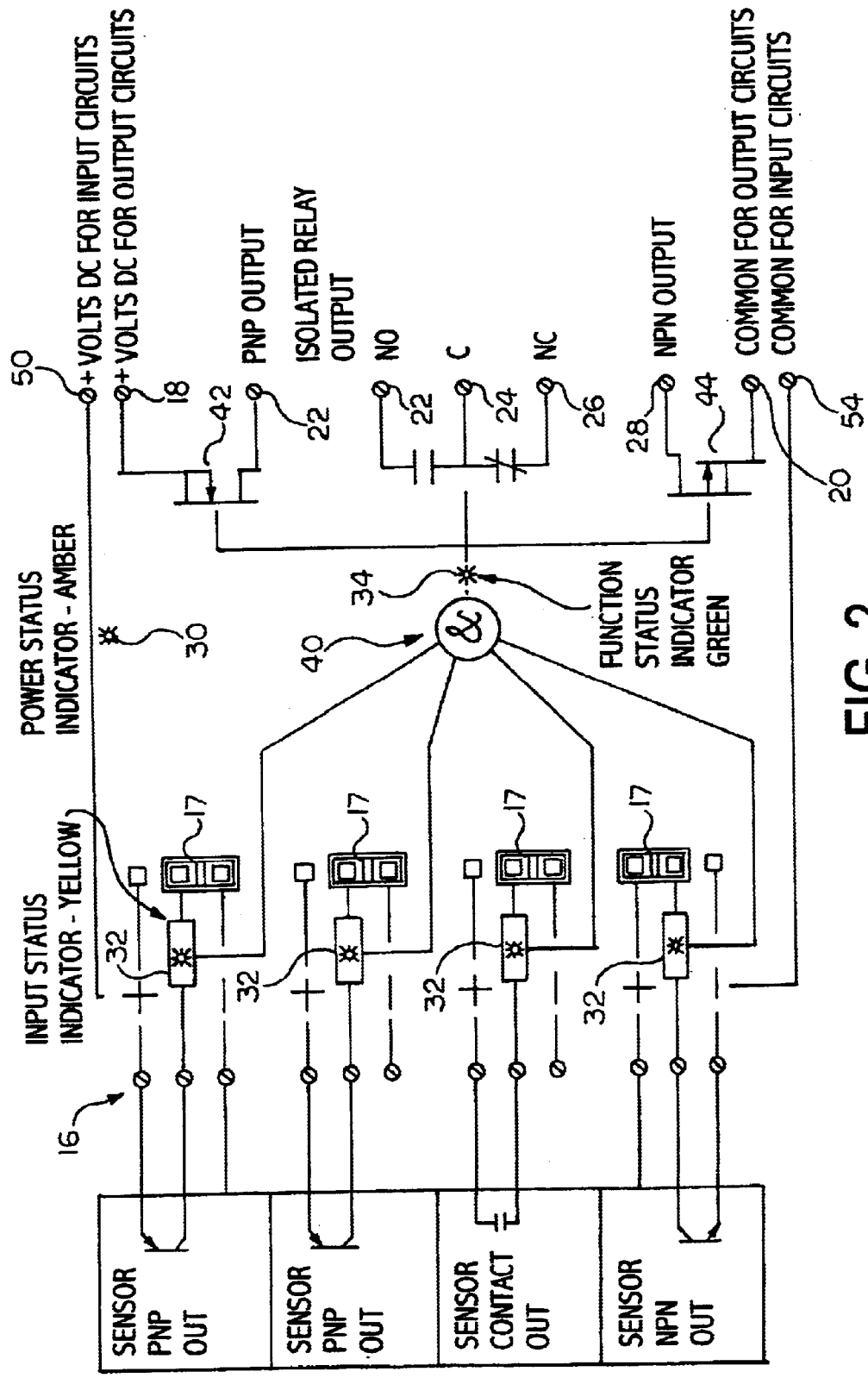
FIG. 2 is a block diagram for the interface junction device that is shown in FIG. 1.

A block diagram for the junction box 10 shown in FIG. 1 is provided in FIG. 2. Components shown in FIG. 2 that are the same as shown in FIG. 1 have the same numerical designators. As shown in FIG. 2, three different types of input circuits are connected to the input terminals 16. The top two input circuits include PNP devices, such as a PNP transistor as shown in the figure. The PNP output devices are connected to the upper two input terminals 16 of each group of three terminals. The corresponding two position shorting plugs 17 are set in their upper position to receive a PNP compatible input signal. Similarly, the third input circuit represents the output of a mechanical limit switch or a set of relay contacts and connected the same as the upper two circuits. The bottom input circuit; however, includes a NPN output device and is connected to the lower pair of input contacts with the corresponding two position shorting plug placed in its lower position. It will be appreciated that the three types of input circuits are shown to illustrate the flexibility of the invention to service different types of input circuits. Indeed, it is contemplated that the invention is compatible with any combination of devices connected to the input terminals, including all PNP output devices, all NPN output devices or all contact type output devices.

As shown in FIG. 2, when a signal is present at a pair of input terminals 16, the corresponding yellow input status indicator LED 32 is illuminated. Upon detection of a signal at a pair of input terminals 16 a signal is sent to an "AND" logic circuit 40, that will be discussed below. Upon receiving signals from all inputs, the logic circuit 40 illuminates the green status indicator LED 34 and actuates the three output devices by energizing the relay coil (not shown) and switching output transistors 42 and 44 from their non-conducting states to their conducting states. As shown in FIG. 2, the upper output transistor 42 is a P channel power Field Effect Transistor (FET); however, the output transistor 42 also can be PNP a bipolar device. Hence, when the upper output FET 42 is switched to its conducting state, it supplies current from the power terminal 18 to the output terminal 22. Similarly, the lower output transistor 44, which is shown as an N channel power FET, may also be a bipolar device. Hence, when the lower output FET 44 is switched to its conducting state, it draws current from the output terminal 28 and directs the current to the common, or ground terminal 20. Thus, the junction device 10 is compatible for connection to three different devices.

Figure 3:
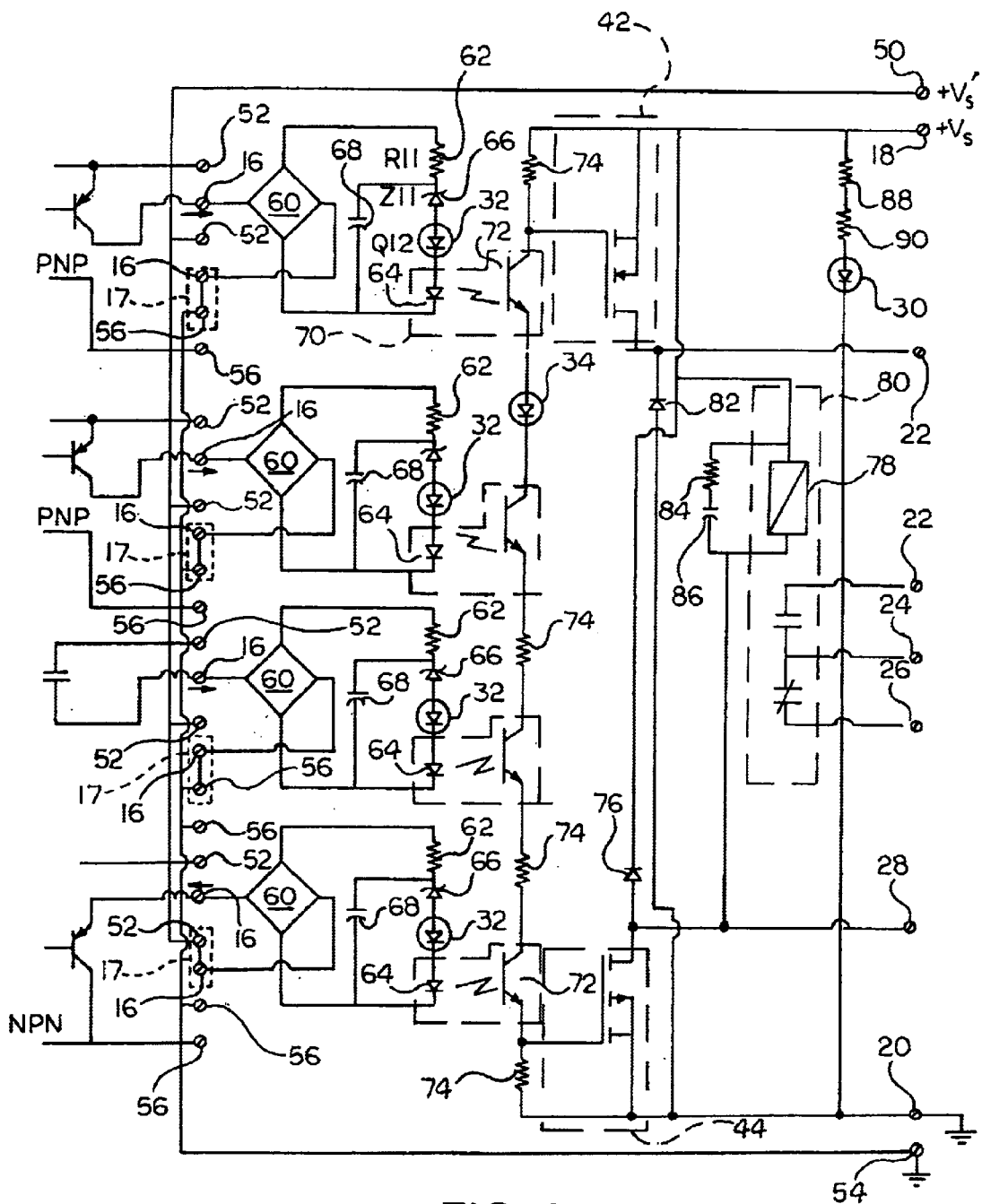
FIG. 3 is a schematic circuit diagram for the interface junction device that is shown in FIG. 1.

A circuit diagram for the four input version of the invention is shown in FIG. 3. As before, components in FIG. 3 that are the same as component shown in FIGS. 1 and 2 have the same numerical designators. As shown in FIG. 3, the circuit includes a secondary power supply terminal 50 that is connected to a plurality of supply terminals 52 along the input side of the circuit. Similarly, a secondary ground connection terminal 54 is provided that is separate from the common terminal 20 described above. The secondary ground terminal 54 is connected to plurality of ground terminals 56 along the input side of the circuit. It is intended that the secondary supply terminal 50 is connected to another power supply indicated by $+V_s'$ in FIG. 3. The invention contemplates that the input circuits are also connected to the secondary power and ground terminals 52 and 56. Thus, a separate power and ground distribution is provided for each input circuit. As will be discussed below, the input signals are isolated from the output of the connection box 10. The secondary power supply and ground provide for complete isolation between the input circuits and their power supplies from the output circuits and their associated power supplies. Additionally, because the input circuits are separated from the outputs, the inventors have successfully connected more than two proximity series switches to a single input with no effect upon the output.

Alternately, a negative power supply can be connected to the secondary ground terminal 54 and the secondary supply terminal 50 can be connected to ground to reverse the current flow through the secondary power circuits. Additionally, if only one power supply is to be used, the power supply terminals 18 and 50 can be electrically connected together with a jumper and, likewise, the ground terminals 20 and 54 can be electrically connected with a jumper.

The input terminals 16, 52 and 56 are grouped as four inputs in FIG. 3. Each of the inputs is connected to an identical input circuit. Accordingly, only one of the four input circuits will be described in detail. The input terminals 16 are connected to input terminals of a full wave bridge rectifier 60. The bridge rectifier enables acceptance of either a positive or a negative input signal. The reference for each input is selected using the two position shorting plug 17 that is associated with each input. For example the top two inputs are illustrated for connection to a PNP device and the current is shown flowing into the rectifier 60 by the small arrow. In contrast, an NPN device is connected to the bottom set of input terminals. Accordingly, the corresponding shorting plug 17 has been shifted to its second position and the current, as indicated by the small arrow now flows out of the bridge circuit 60. The third set of input terminals from the top are shown as being connected to a dry contact device, such as a mechanical limit switch or relay contacts. While the dry contact device is shown as being connected the same as the PNP devices above it in the figure, it will be appreciated that it also can be connected the same as the NPN device if a reverse current flow is desired. While shoring plugs 17 have been shown in FIG. 3, it will be appreciated that the invention also can be practiced with miniature switches, such as, for example, dip switches.

The output of the bridge rectifier 60 is connected across a series connection of a current limiting resistor 62 and an optical coupler diode 64. A Zener diode 66 that limits the voltage level and the corresponding input status LED 32 are connected between the current limiting resistor 62 and the bridge rectifier 60. A capacitor 68 is connected across the Zener 66, status LED 32 and optical coupler diode 64 to filter out high frequency signals and electromagnetic radiation effects.

The optical coupler diode 64 is included in a conventional optoisolator dual transistor 70 that includes an output transistor 72. When a signal is present across the input terminals 16, the bridge rectifier 60 causes a current to flow through the optical coupler diode 64. The diode 64 is responsive to the current to illuminate the output transistor 72. Upon illumination, the output transistor 72 saturates, or changes from a non-conducting to a conducting state. The output transistor 72 remains saturated as long as an input signal is present across the input terminals 16. Upon removal of the input signal, the diode 64 is extinguished and the output transistor 72 reverts to its non-conducting state. The optoisolator dual transistors 70 provide isolation between the input signals and the output signal.

As shown in FIG. 3, each of the input circuits is connected to a corresponding opto-isolator dual transistor 70 that are connected in series. The transistors 70 are separated by gate bias resistors 74. Additionally, the logic status LED 34 is connected in series with two of the transistors 70. The series connection of the transistors provides an AND logic function in that a current can only flow through the transistors 70 when all of the transistors 70 are in their conducting state.

The gate of the upper output transistor 42, which is shown as a P channel power FET in FIG. 3, is connected to the collector of the top output transistor 72, while the gate of the lower output transistor 44, which is shown as an N channel power FET, is connected to the emitter of the bottom output transistor 72. Drain of the P channel power FET 42 is connected to the PNP output terminal 42. The drain of the P channel FET 42 also is connected through a first flyback diode 76. Similarly, the drain of the N channel FET 44 is connected to the NPN output terminal 28 and to one side of a coil 78 for the output relay 80. The N channel FET drain is also connected to a second flyback diode 82. A resistor 84 and a capacitor 86 are connected in series across the relay coil 78 as a snubber to absorb the coil current when the relay is deactuated.

Finally, as also shown in FIG. 3, one lead for the power status LED 30 is connected through a pair of current limiting resistors 88 and 90 to the supply terminal 18 while the other lead is connected to the ground terminal 20. Thus, the power status LED 30 is illuminated whenever there is power present at the supply terminal 18.

The operation of the circuit will now be explained. The outputs or the sensors circuits are connected to the input terminals. As illustrated in FIG. 3, an additional connection can be made to supply power or ground to the input circuit. Alternately, as described above, both power and ground can be provided for each of the input circuits (not shown). Upon a sensor signal being generated across a pair of input terminals 16, the corresponding yellow input status LED 32 is illuminated and the corresponding optoisolator dual transistor 72 is switched to its conducting state. When sensor signals are present at all of the inputs, all of the optoisolator dual transistors 72 are conducting and the resulting current flowing through the gate bias resistors cause a voltage to appear across the gates of the FET's 42 and 44 to cause the FET's to switch from a non-conducting state to a conducting state. Additionally, the green logic status LED 34 is illuminated.

Upon the N channel FET 44 switching to a conducting state, current can flow from the supply terminal 18 through the relay coil 78. This closes the normally open relay contacts between output terminals 22 and 24 and opens the normally closed relay contacts between output terminals 24 and 26. Also, with the FET's 42 and 44 in their conducting state, current can flow through the corresponding output terminals 22 and 28, respectively.

Upon any one of the input signals being interrupted, the corresponding optoisolator dual transistor 72 will revert to its non-conducting state which will block the flow of current through the gate bias resistors 74. As a result the output FET's 42 and 44 will also revert to their non-conducting state and thereby block any current flow through their respective output terminals 22 and 28. Also, the current flow through the relay coil 78 will be interrupted, deactuating the relay 80.

As was indicated above, the circuit shown in FIG. 3 is intended to be exemplary. The invention may be practiced with two or more input circuits. In the preferred embodiment, the number of input circuits is intended to be an even number. However, it is possible to practice the circuit with an odd number of input circuits (not shown). Additionally, it also is possible to use an embodiment of the having an enven number of input circuits with an odd number of input signals. All that is need is to jumper the input terminals of the unneeded input circuit to the power supply and ground to simulate an input signal and to cause the associated optoisolator dual transistor 72 to switch to its conducting state.

Figure 4:
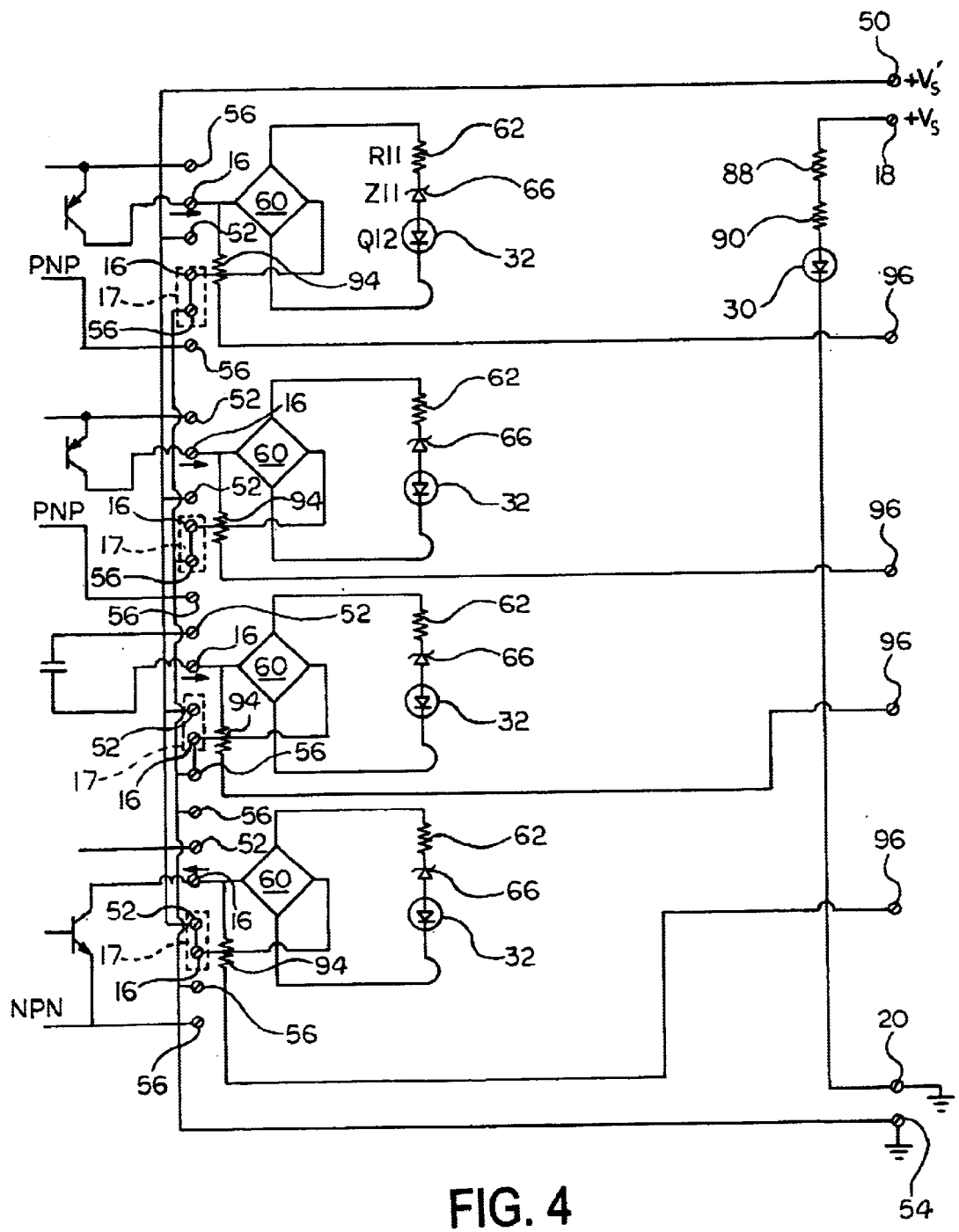
FIG. 4 is a schematic circuit diagram for an alternate embodiment of the interface junction device that is shown in FIG. 1.

The inventors also contemplate an alternate embodiment that is illustrated in FIG. 4. As before, components in FIG. 4 that are the same as components in the preceding figures have the same numerical designators. As shown in FIG. 4, the input circuits are the same as shown in FIG. 3, except that the optoisolator dual transistors 70 have been omitted. However, the power status LED 30 and input signal status LED's 32 have been retained. A lead now runs from one of the input terminals 16 through a zero ohm resistor 94, or jumper, to a corresponding output terminal 96. An output terminal 96 is provided for each of the four input circuits shown in FIG. 4. Thus, a signal appearing at an input terminal 16 is transferred to a corresponding output terminal 96. Because an output signal is available whenever any input signal is present, the circuit in FIG. 4 functions as a pass through circuit. The inventors have found that one printed circuit board can be utilized to produce either of the circuits shown in FIGS. 3 and 4 and thus have achieved substantial cost reductions.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. Thus, while the invention has illustrated and described as a junction box and interface between a plurality of sensors and a robotic device, it will be appreciated that the invention also can be used for other purposes, such as, for example, machine to controller wiring for PLC controls. Thus, the invention can be included in any machine tool or other device requiring inputs connected to outputs. The invention not only provides the capability to combine input signals by also provides a visual indication of the status of the individual sensors and the internal logic.

What is claimed is:

1. A connection device comprising:
    a plurality of input devices adapted to be connected to at least two signal sources;
    an output switch adapted to be connected to an electrical device; and
    a device electrically connected to said input devices and electrically isolated from said switch, said device in communication with said switch and operative to cause said switch to change from a first state to a second state when there is a signal present at each of said input devices.

2. The connection device according to claim 1 wherein said devices connected to said input device includes an AND logic circuit.

3. The connection device according to claim 2 wherein each of said input device includes a full wave rectifier connected between the corresponding signal source and said AND logic circuit.

4. A connection device comprising:
    a plurality of input devices adapted to be connected to at least two signal sources, each of said input devices including a full wave rectifier;
    an output switch adapted to be connected to an electrical device; and
    a device electrically connected between said input devices and said switch, said device including an AND logic circuit that includes a plurality of optoisolator dual transistors connected in series, said transistors having inputs connected to the outputs of said rectifier bridge circuits such that a current flows through said optoisolator dual transistors only when an input signal is present for all of said rectifier bridge circuits, said device operative to cause said switch to change from a first state to a second state when there is a signal present at each of said input terminals.

5. The connection device according to claim 4 wherein said output switch is connected to said optoisolator dual transistors and is operable only when said current is flowing through said optoisolator dual transistors.

6. The connection device according to claim 5 wherein said output switch includes a PNP electronic switching device that is changed from a non-conducting state to a conducting state when said current is flowing through said optoisolator dual transistors.

7. The connection device according to claim 5 wherein said said output switch includes a P-channel field effect transistor that is changed from a non-conducting state to a conducting state when said current is flowing through said optoisolator dual transistors.

8. The connection device according to claim 5 wherein said output switch includes a NPN electronic switching device that is changed from a non-conducting state to a conducting state when said current is flowing through said optoisolator dual transistors.

9. The connection device according to claim 5 wherein said said output switch includes a N-channel field effect transistor that is changed from a non-conducting state to a conducting state when said current is flowing through said optoisolator dual transistors.

10. The connection device according to claim 9 wherein said N-channel field effect transistor is connected to a relay coil and is operative to actuate said relay when said N-channel field effect transistor is in its conducting state.

11. The connection device according to claim 10 further including an input status light emitting diode connected to each of said full wave rectifiers, the input status diode being illuminated when an input signal is present.

12. The connection device according to claim 11 further including a logic status light emitting diode connected between two of said optoisolator dual transistors, said logic status light emitting diode being illuminated when said current is flowing through said optoisolator dual transistors.

13. The connection device according to claim 12 further including a separate power supply and ground for said input devices such that said input signals are totally isolated from said output signals.

14. The connection device according to claim 12 wherein said input signals can be one of current source, current sink and dry contact signals.

15. The connection device according to claim 5 wherein said output device is compatible with one of current source, current sink and dry contact signals.

16. A connection device comprising:
a plurality of input terminals adapted to be connected to at least two signal sources; and
a device connected to said input terminals that is operative to generate an output signal that is directly proportional to a signal appearing at any one of said input terminals.

17. The connection device according to claim 16 further including a full wave rectifier circuit having input terminals connected to each of said input terminals, said rectifier circuit having a input status light emitting diode connected to its output terminals, said input status light emitting diode being illuminated when an input signal is present.

18. A connection device comprising:
a plurality of input devices adapted to be connected to at least two signal sources, each of said input devices capable to receive one of a current source, current sink and dry contact signals;
an plurality of output devices adapted to be connected to an electrical device, each of said output devices being capable to be connected to one of a current source, current sink and dry contact signals; and
an interface device electrically connected to said input devices and electrically isolated from said output devices, said interface device in communication with said output devices and operative to cause said output devices to change from a first state to a second state when there is a signal present at each of said input devices.

19. The connection device according to claim 18 wherein each of said input devices includes a full wave rectifier.

20. A connection device comprising:
a plurality of input devices adapted to be connected to at least two signal sources, each of said input devices capable to receive one of a current source, current sink and dry contact signals;
a plurality of output devices adapted to be connected to an electrical device, each of said output devices being capable to be connected to one of a current source, current sink and dry contact signals; and
an interface device electrically connected between said input and output devices, said interface device operative to cause said output devices to change from a first state to a second state when there is a signal present at each of said input devices, said interface device including at least one optoisolator dual transistor.

21. The connection device according to claim 20 wherein said interface device includes a plurality of optoisolator transistors that are connected in series to provide an AND logic circuit.

22. The connection device according to claim 21 wherein each of said output devices includes one of a P-channel field effect transistor, an N-channel field effect transistor and a relay whereby both said input and output devices are compatible with current source, current sink and dry contact signals.

23. The connection device according to claim 22 further including a first set terminals adapted to be connected to a first power supply for supplying power to said input devices and a second set of terminals adapted to be connected to a second power supply for supplying power to said output devices whereby said input devices are electrically isolated from said output devices.

* * * * *